(12) United States Patent
Shi et al.

(10) Patent No.: US 11,305,456 B2
(45) Date of Patent: Apr. 19, 2022

(54) SELECTIVE LASER SINTERING DEVICE

(71) Applicant: Huazhong University of Science and Technology, Wuhan (CN)

(72) Inventors: Yusheng Shi, Wuhan (CN); Chunze Yan, Wuhan (CN); Zhaoqing Li, Wuhan (CN); Peng Chen, Wuhan (CN); Zhufeng Liu, Wuhan (CN); Jiamin Wu, Wuhan (CN); Shifeng Wen, Wuhan (CN); Chenhui Li, Wuhan (CN); Lichao Zhang, Wuhan (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 205 days.

(21) Appl. No.: 16/655,215

(22) Filed: Oct. 16, 2019

(65) Prior Publication Data
US 2020/0376708 A1    Dec. 3, 2020

(30) Foreign Application Priority Data
May 27, 2019  (CN) .......................... 201910447966.2

(51) Int. Cl.
| | |
|---|---|
| *B28B 1/00* | (2006.01) |
| *B33Y 10/00* | (2015.01) |
| *B33Y 30/00* | (2015.01) |
| *B33Y 40/00* | (2020.01) |
| *B29C 64/153* | (2017.01) |
| *B29C 64/232* | (2017.01) |
| *B29C 64/245* | (2017.01) |

(Continued)

(52) U.S. Cl.
CPC ............ *B28B 1/001* (2013.01); *B29C 64/153* (2017.08); *B29C 64/232* (2017.08); *B29C 64/236* (2017.08); *B29C 64/245* (2017.08); *B29C 64/25* (2017.08); *B29C 64/35* (2017.08); *B33Y 10/00* (2014.12); *B33Y 30/00* (2014.12); *B33Y 40/00* (2014.12); *C23C 16/24* (2013.01)

(58) Field of Classification Search
CPC .................................................... B28B 1/001
See application file for complete search history.

(56) References Cited

U.S. PATENT DOCUMENTS

| | | | |
|---|---|---|---|
| 2016/0354840 A1* | 12/2016 | Kulinsky | .............. B29C 64/153 |
| 2017/0120332 A1* | 5/2017 | DeMuth | .............. B23K 26/142 |

(Continued)

*Primary Examiner* — Matthew J Daniels
*Assistant Examiner* — Paul Spiel
(74) *Attorney, Agent, or Firm* — JCIPRNET

(57) ABSTRACT

A selective laser sintering (SLS) device. The SLS device includes a laser forming unit, a support platform and a driving mechanism. The support platform is configured to support a plurality of raw materials for additive manufacturing of an object including a plurality of sections. The laser forming unit is disposed on the support platform and is configured to lay powders on a surface of each section of the object and sinter the powders. The driving mechanism is disposed under the laser forming unit and includes a vertical driving mechanism and a horizontal driving mechanism. The vertical driving mechanism is connected to the laser forming unit and configured to lift the laser forming unit layer by layer. The horizontal driving mechanism is configured to drive the laser forming unit to move in a horizontal direction with respect to the support platform.

14 Claims, 5 Drawing Sheets

(51) Int. Cl.
*B29C 64/236* (2017.01)
*B29C 64/35* (2017.01)
*B29C 64/25* (2017.01)
*C23C 16/24* (2006.01)

(56) References Cited

U.S. PATENT DOCUMENTS

2017/0173696 A1* 6/2017 Sheinman .............. B33Y 10/00
2021/0197285 A1* 7/2021 Schodin ................. B22F 10/64

* cited by examiner

SELECTIVE LASER SINTERING DEVICE

CROSS-REFERENCE TO RELAYED APPLICATIONS

Pursuant to 35 U.S.C. § 119 and the Paris Convention Treaty, this application claims foreign priority to Chinese Patent Application No. 201910447966.2 filed May 27, 2019, the contents of which, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND

The disclosure relates to the field of additive manufacturing, and more particularly to a selective laser sintering (SLS) device for manufacturing complex parts.

Additive manufacturing process builds a three-dimensional object from a computer-aided design (CAD) model, usually by successively adding material layer by layer, which is also known as additive manufacturing. One of the key advantages of additive manufacturing is the ability to produce complex shapes or geometries. A prerequisite for producing a 3D printed object is a digital 3D model or a CAD file.

Conventionally, the operation platform of the selective laser sintering devices for additive manufacturing is relatively small and is inapplicable to large-sized complex parts. The manufacturing of a complex part conventionally involves a plurality of steps and manual assembly. This increases the probability of structural errors and reduces the precision and manufacturing efficiency.

SUMMARY

The disclosure provides a selective laser sintering (SLS) device for manufacturing a complex object. The SLS device comprises a laser forming unit, a support platform and a driving mechanism.

The support platform is configured to support a plurality of raw materials for additive manufacturing of an object comprising a plurality of sections; the laser forming unit is disposed on the support platform and is configured to lay powders on a surface of each section of the object and sinter the powders; the driving mechanism is disposed under the laser forming unit and comprises a vertical driving mechanism and a horizontal driving mechanism; the vertical driving mechanism is connected to the laser forming unit and configured to lift the laser forming unit layer by layer according to a height of each section of the object so that the object is processed in a vertical direction with respect to the support platform; and the horizontal driving mechanism is configured to drive the laser forming unit to move in a horizontal direction with respect to the support platform so that the laser forming unit moves over the support platform or separates from the support platform. The forming parts are kept on the support platform for subsequent processes without moving after the completion of SLS forming.

The laser forming unit comprises a housing, two powder cylinders, a separator, a powder laying unit, a laser unit, and a plurality of heating units; the powder laying unit is disposed in the housing and comprises a plurality of powder cylinders and a roller; the plurality of powder cylinders is symmetrically disposed on both sides of the support platform; the roller is configured to move back and forth between the plurality of powder cylinders and the support platform to bring powders in the plurality of powder cylinders to the support platform; the separator is disposed in the housing and divides the housing to a first half and a second half; the lasering unit is disposed in the first half, comprises a laser and an oscillating mirror, and is configured to emit a laser to sinter the powders on the support platform; the plurality of heating units is disposed in the second half and is configured to preheat the powders on the support platform prior to the sintering of the powders.

The support platform comprises a groove to accommodate the powders brought from the plurality of powder cylinders; the groove comprises a sidewall adapted to move vertically with respect to the support platform.

The housing comprises an inner wall and a thermal insulation layer attached to the inner wall.

In another aspect, the disclosure provides a selective laser sintering system comprising the aforesaid selective laser sintering device, a powder cleaning device, and a curing-carbonization device. The horizontal driving mechanism of the device comprises two guide rails disposed on both sides of the support platform; the selective laser sintering device, the powder cleaning device, and the curing-carbonization device each comprises a plurality of pulleys adapted to slide on the guide rails. Each device in turn carries out selective laser sintering, powder cleaning, post-curing and carbonization processes for the parts to be formed on the support platform.

The powder cleaning device comprises a chamber, a rotating rail, an air outlet, and an air inlet; the rotating rail, the air outlet, and the air inlet are disposed in the chamber; and the air outlet and the air inlet are disposed on the rotating rail.

The curing-carbonization device comprises a sealed chamber, an intake pipe, an exhaust pipe, and a heating mechanism disposed in the sealed chamber; and the intake pipe and the exhaust pipe are disposed on the seal chamber.

According to another aspect of the disclosure, also provided is a method for forming a SiC ceramic object using the aforesaid system, the method comprising:

1) building a 3D model of an object, slicing the 3D model, and acquiring data of a plurality of section surfaces of the 3D model; employing a resin or a resin composite material as a raw material; placing the raw material in the selective laser sintering which comprises a housing, a separator, a powder laying unit, a lasering unit, and a plurality of heating units; according to the data of a plurality of section surfaces of the 3D model, laying, by the powder laying unit, powders on the support platform; preheating the powders by the plurality of heating units; sintering the powders by the lasering unit, to complete the processing of a first section of the object; lifting the selective laser sintering, processing a second section of the object; repeating the lifting and processing, to yield a green part of the object;

2) removing the selective laser sintering device from the support platform, moving the powder cleaning device on the support platform, opening the air outlet and the air inlet, rotating the rotating rail, to remove the powders on the green part of the object; and the green part is cleaned by rotating 360 degrees; and 3) removing the powder cleaning device from the support platform; moving the curing-carbonization device on the support platform, the curing-carbonization device comprising a sealed chamber and a heating mechanism, which is seamlessly connected with the sealed chamber and the support platform, and heating to cure the green part of the object by the heating mechanism; filling the sealed chamber with an inert gas or vacuumizing the sealed chamber, heating the green part to 600-1500° C. to yield a carbonized preform of the object, and siliconizing the carbonized preform to obtain a SiC ceramic object.

In 3), siliconizing the carbonized preform adopts a precursor-infiltration-pyrolysis (PIP) method, a chemical vapor infiltration (CVI) method or a reactive infiltration method.

Advantages of the selective laser sintering device according to embodiments of the disclosure are summarized as follows:

1. The SLS device comprises a laser forming unit and a support platform. The support platform is fixedly disposed and the laser forming unit can move vertically with respect to the support platform. The complex object is formed layer by layer on the support platform without moving relative to the support platform, thus reducing the probability of bending, deformation, collapse, or deformation of the object, improving the product quality.

2. The selective laser sintering device comprises a housing and a plurality of heating units. The support platform is sealed in the housing and the raw materials is evenly preheated by the plurality of heating units prior to forming the object. In addition, through the coordination of insulation layer and heating unit, the temperature distribution in the forming cavity can be uniform, so as to avoid the warping deformation caused by uneven temperature distribution.

3. The SLS system for manufacturing a SiC ceramic object comprises a SLS device, a powder cleaning device, and a curing-carbonization device. The formation and processing of the object can be achieved in one step, improving the processing efficiency.

4. The method of forming a SiC ceramic object comprises forming a green part by SLS, powder cleaning, curing, carbonization, and siliconizing. The method can be used to manufacturing a product with any three-dimensional structure.

Figure 1:
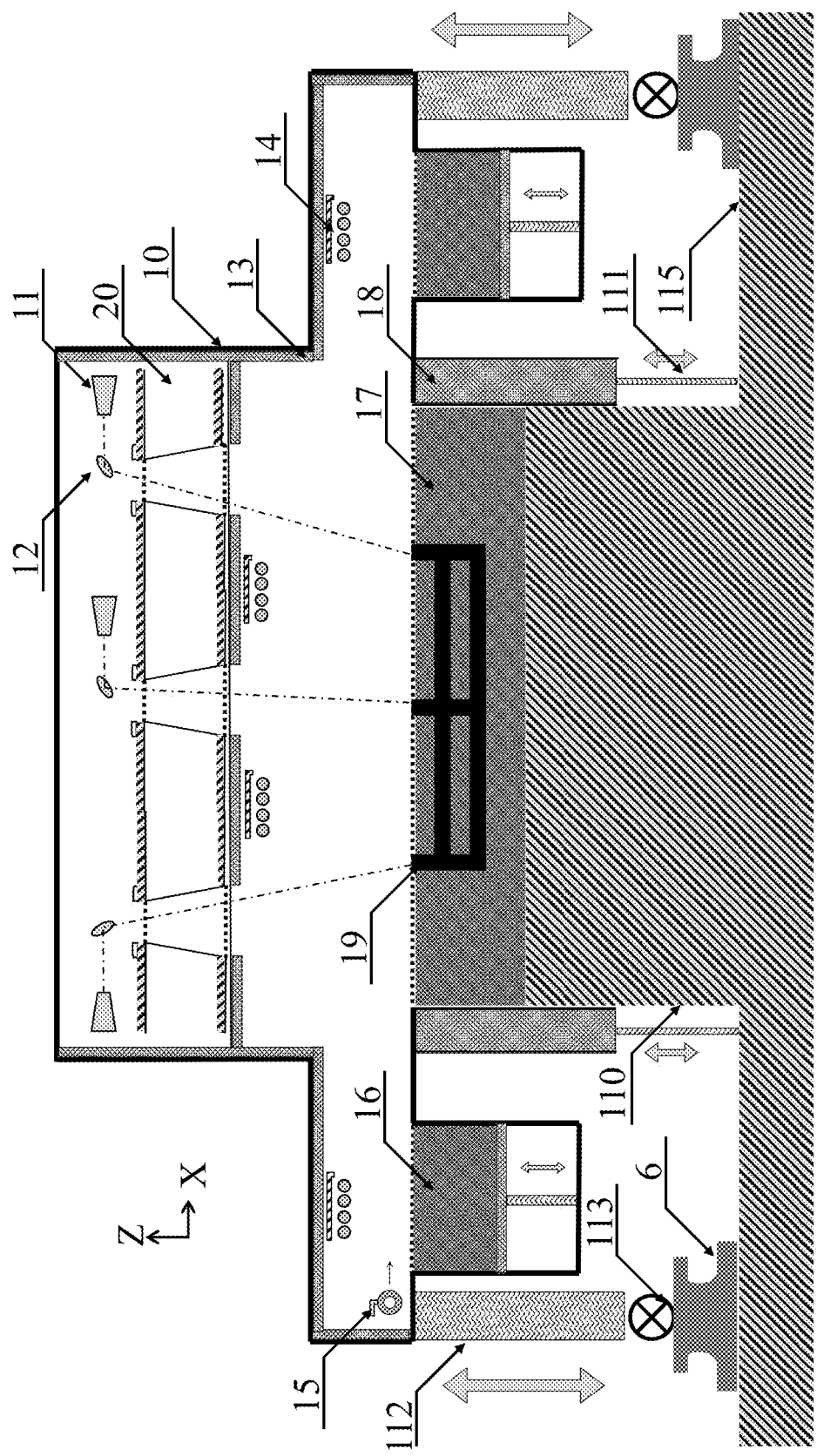
FIG. 1 is a schematic diagram of a selective laser sintering (SLS) device for manufacturing a complex object according to one embodiment of the disclosure.

In the drawings, the following reference numbers are used: 1. Selective laser sintering device; 2. Powder cleaning device; 3. Curing-carbonization device; 6. Guide rail; 10. Housing; 11. Laser; 12. Oscillating mirror; 13. Thermal insulating layer; 14. Heating unit; 15. Roller; 16. Powder cylinder; 17. Groove; 18. Sidewall; 19. Formed blank; 20. Separator; 21. Air outlet; 22. Air inlet; 23. Rotating rail; 24. Door of chamber; 25. Chamber; 30. Sealed chamber; 31. Door of sealed chamber; 32. Sealed layer; 33. Heating mechanism; 34. Intake pipe; 35. Exhaust pipe; 110. Support platform; 111. Lifting mechanism; 112. Vertical driving mechanism; 113. Pulley; 115. Ground.

DETAILED DESCRIPTION

To further illustrate, embodiments detailing a selective laser sintering device for manufacturing a complex object are described below. It should be noted that the following embodiments are intended to describe and not to limit the disclosure.

The disclosure provides a SLS device for manufacturing a large-size and complex object, and a SLS system and a method thereof. The SLS system comprises a SLS device comprising a support platform, a powder cleaning device, and a curing-carbonization device. The support platform is unmovable and the raw materials are processed on the support platform. The SLS device comprises a laser forming unit, a plurality of lasers and oscillating mirrors for producing a blank of an object. The powder cleaning device and the curing-carbonization device can slide on the guide rails of the SLS device to further process the blank of the object.

FIG. 1 is a schematic diagram of a SLS device for manufacturing a large-size and complex object according to one embodiment of the disclosure. As shown in FIG. 1, the SLS device comprises a laser forming unit, a support platform and a driving mechanism; the support platform is a platform for forming an object, the laser forming unit is disposed on the support platform and is configured to lay powder on the section surface of the object and sinter the powders; the driving mechanism is disposed under the laser forming unit and comprises a vertical driving mechanism and a horizontal driving mechanism. After the laser forming unit completes a SLS process on one section surface on the support platform, the vertical driving mechanism lifts the laser forming unit layer by layer according to the height of each section of the object so that the object is processed in a vertical direction with respect to the support platform, which avoids up and down movement of the parts due to a moving support platform. And the horizontal driving mechanism is configured to drive the laser forming unit to move in a horizontal direction with respect to the support platform so that the laser forming unit moves over the support platform or separates from the support platform, avoiding moving the parts in subsequent processing.

The SLS device comprises a housing 10 and a powder laying unit; the powder laying unit is disposed in the housing and comprises a plurality of powder cylinders 16 and a roller 15; the plurality of powder cylinders 16 is symmetrically disposed on the both sides of the support platform; the roller 15 moves back and forth between the plurality of powder cylinders and the support platform, so that the powder brought from the plurality of powder cylinders 16 is evenly laid on the support platform; the housing 10 is internally provided with a separator 20, the inner space of the separator is divided into a first half and a second half; the first half comprises a laser configured to emit a laser sinter the powder on the support platform. The second half as a forming cavity for the parts, internally provided with a plurality of uniformly distributed heating units 14, aiming to preheat the powder on the support platform prior to the sintering of the powders.

A plurality of laser units and heating units 14 are disposed in the housing; the laser unit each comprises a laser 11 and an oscillating mirror 12. In this embodiment, 3×3 sets of laser units are disposed for manufacturing the parts of about 5 meters; the powder on the support platform is preheated by heating units 14 prior to the sintering of the powders; the heating method may be resistance heating and radiant heating; a thermal insulating layer 13 is deposited in the housing, and the temperature is evenly distributed in the forming cavity to uniformly preheat the powder; and the temperature distribution in the forming cavity is evenly distributed to uniformly preheat the powder; the separator 20 is disposed in the housing and separates the laser unit from the forming cavity to prevent the laser from overheating.

The SLS device adopts two methods of powder supply including falling powder and laying powder; the plurality of powder cylinders is fixed on the laser forming unit; the heating is disposed in the plurality of powder cylinders and is configured to preheat the powder; the roller is quantitatively lifted along with the SLS device 1 by a vertical driving mechanism 112 supported on the guide rails, realizing a quantitative rise of the powder bed; the SLS device 1 comprises a plurality of lasers and oscillating mirrors which cooperate to complete a rapid and high-quality forming of a large-size object; the SLS device 1 employs a large amount of data processing software and hardware to plan a multi-laser scanning path; a horizontal driving mechanism is disposed under the laser forming unit; the horizontal driving mechanism comprises a guide rail 6 which is disposed under the laser forming unit and cooperates with the pulleys 113; the laser forming unit can be moved to or removed from the support platform by sliding on the guide rail 6.

The support platform comprises a groove 17, and the powder is spread across the groove 17; after one section surface is formed, the sidewall of the groove lifts the height of a single section surface, avoiding the powder spilled from the groove scattering over other area; the formed blank 19 is in the groove 17; the lifting mechanism 111 on the sidewall rises along with the vertical driving mechanism 112 of the laser forming unit.

Figure 2:
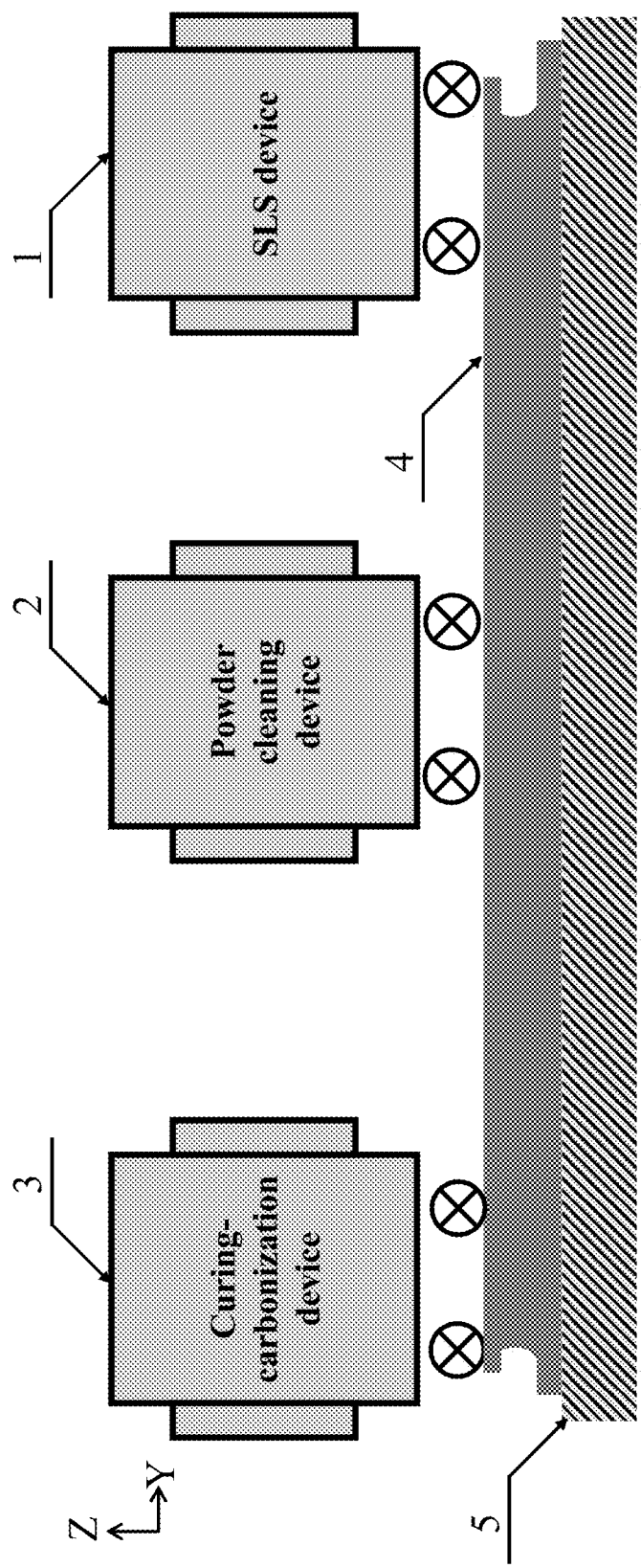
FIG. 2 is a schematic diagram of a selective laser sintering (SLS) system for manufacturing a complex object according to one embodiment of the disclosure.

FIG. 2 is a schematic diagram of a selective laser sintering (SLS) system for manufacturing a complex object according to one embodiment of the disclosure. As shown in FIG. 2, the system comprises a SLS device, a powder cleaning device 2, and a curing-carbonization device 3. The horizontal driving mechanism of the SLS device comprises two guide rails 6 disposed on both sides of the support platform; the guide rails 6 are disposed on the ground 115; the SLS device 1, the powder cleaning device 2 and the curing-carbonization device 3 each comprises a plurality of pulleys 113 that cooperates with the guide rail 6 to work; the SLS device, the powder cleaning device and the curing-carbonization device slide on the guide rails 6; and the object on the support platform are sequentially subjected to the powder sintering, powder removal and curing-carbonization.

Figure 3:
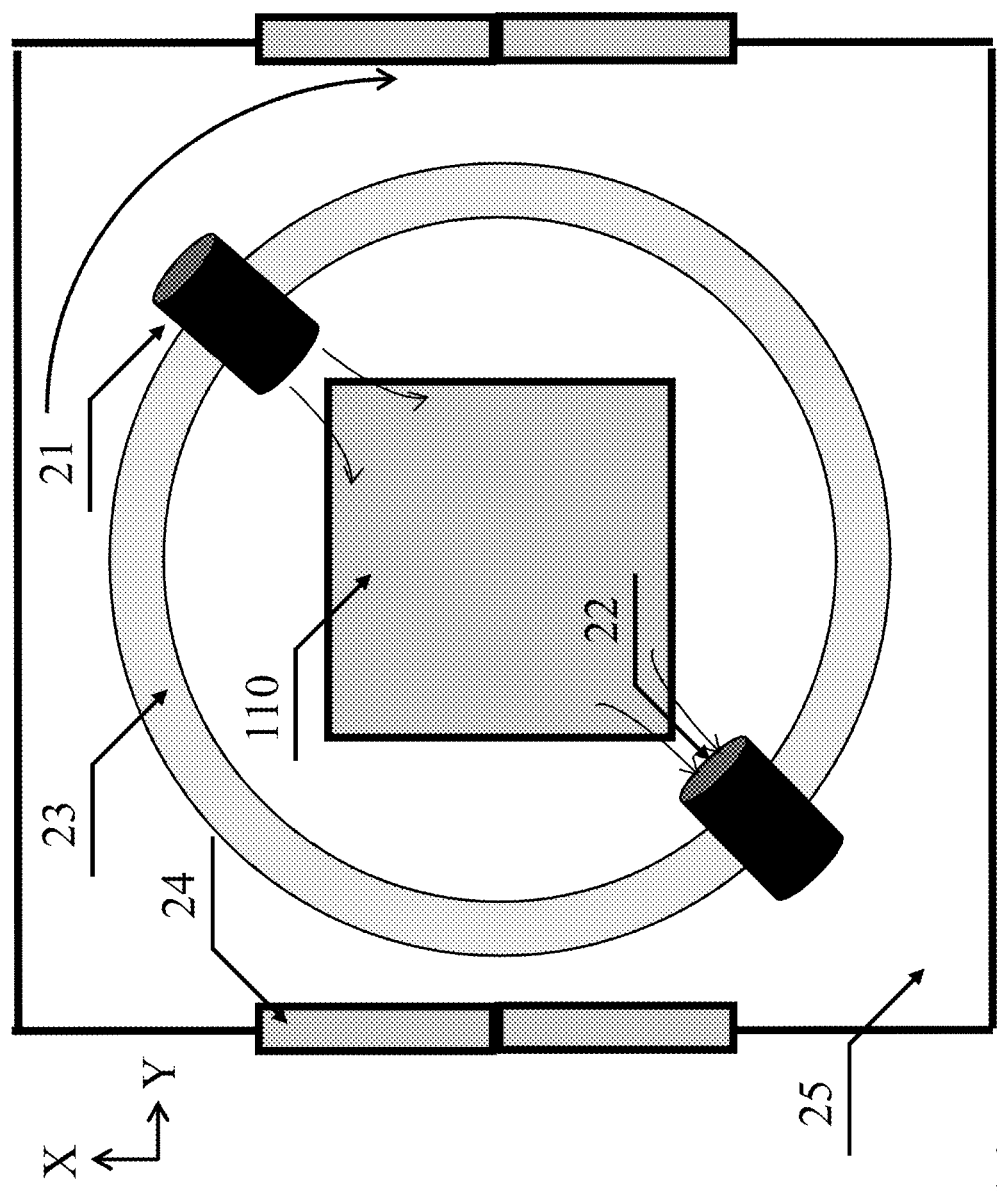
FIG. 3 is a top view of a powder cleaning device according to one embodiment of the disclosure.

FIG. 3 is a top view of a powder cleaning device according to one embodiment of the disclosure. As shown in FIG. 3, the powder cleaning device 2 comprises a chamber 25, and a rotating rail 23, an air outlet 21 and an air inlet 22. The air inlet are disposed in the chamber; and the air outlet and the air inlet are disposed on the rotating rail; when the powder cleaning device 2 is moved over the building platform, the building platform is located in the center of the rotating rail of the chamber 25, and the door 24 of the chamber is thus closed; the air outlet and the air inlet rotate on the rotating rail and cooperate with each other, to clean the powder covered on the green part by blowing and suction from 360 degrees.

The powder cleaning device 2 slides via the guide rails 6, which make the powder cleaning device move to the support platform without moving the support platform; the powder cleaning device has an powder air outlet and an powder air inlet, as well as the powder air outlet is opposite to the powder air inlet and both simultaneously work; the powder blowing and powder suction equipment can be rotated at 360 degrees to achieve omnibearing powder blowing and powder suction, improving the quality of cleaning the powder.

Figure 4:
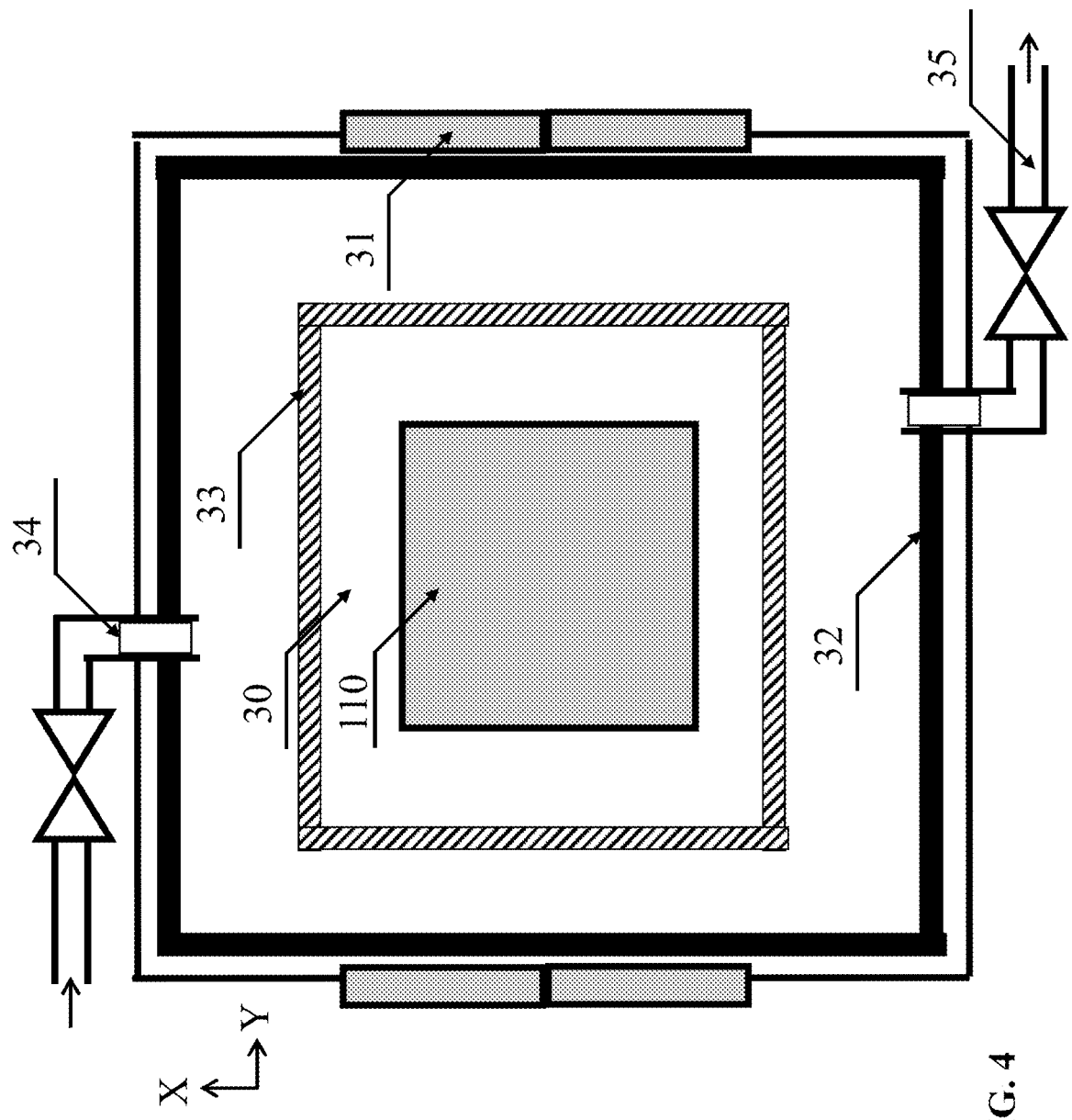
FIG. 4 is a top view of a curing-carbonization device according to one embodiment of the disclosure.

FIG. 4 is a top view of a curing-carbonization device according to one embodiment of the disclosure. As shown in FIG. 4, the curing-carbonization device 3 comprises a sealed chamber 30 and a heating mechanism 33, and a sealed layer 32 is disposed in the sealed chamber 30 and is configure to seal the parts on the forming table; and the curing-carbonization device is moved over the building mechanism to close the door 31 of the sealed chamber; the heating mechanism 33 is disposed to surround the support platform and is configure to heat and cure the shaped object; an intake pipe 34 and an exhaust pipe 35 is disposed in the sealed chamber 30, maintaining the vacuum or inert gas in the sealed chamber 30; the intake pipe 34 is configured to discharge the inert gas, and the exhaust pipe 35 is responsible for vacuuming and exhaust the gas.

The curing-carbonization device 3 slides on the guide rail 6, which make the curing-carbonization device move to the support platform without moving the support platform; the curing-carbonization device 3 has a front furnace door and a rear furnace door along the direction of the guide rails 6, which realizes the sealed treatment of the object; the curing-carbonization device 3 is cured by heating, and the heating mechanism can heat the parts up to 1000° C., and then cure the shaped object.

Figure 5:
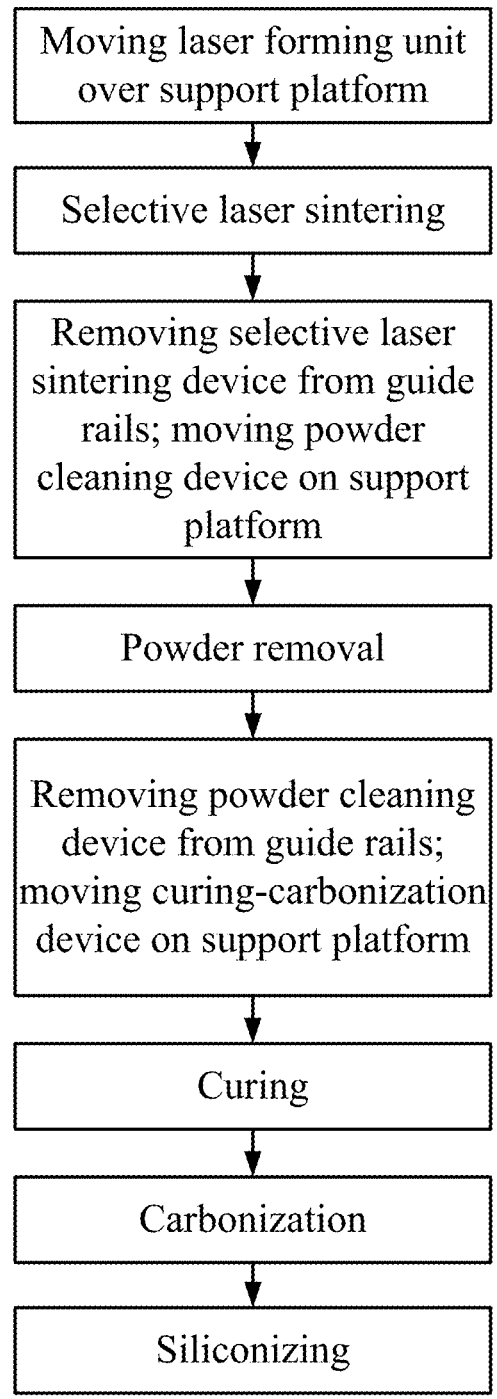
FIG. 5 is a flow diagram of a method of manufacturing a complex object according to one embodiment of the disclosure.

FIG. 5 is a flow diagram of a method of manufacturing a complex object according to one embodiment of the disclosure. A method for manufacturing a large-size and complex SiC ceramic object is summarized as follows:

(1) Selective Laser Sintering

The SLS device slides on the upper surface of the support platform 110 via the guide rails 6 and the pulleys 113; the plurality of powder cylinders 16 and the powder distributing roller are fixed on the SLS device and are quantitatively lifted along with the SLS device by a vertical driving mechanism 112 supported on the guide rails, realizing a quantitative rise of the powder bed; the groove 17 is fixed on the upper surface of the support platform 110, and the sidewall of the groove is synchronously raised by the lifting mechanism 111 with the rise of the powder bed; the SLS device comprises a plurality of lasers and oscillating mirrors which cooperate to complete a rapid and high-quality manufacturing of a large-size object; the SLS device 1 employs a big data processing software and hardware to plan a multi-laser scanning path.

(2) Powder Removal

The SLS device 1 is removed along the guide rails 6 after sintering the powder, and the powder cleaning device 2 slides on the upper surface of the support platform; the sidewall 18 of the groove 17 moves down under the control of the lifting mechanism 111; the air outlet 21 and the air inlet 22 are opened, and the guide rails 23 start to rotate to complete a 360-degree rotation cleaning.

(3) Curing

Following the powder removal process, the powder cleaning device 2 is removed via the guide rails 6, and the curing-carbonization device 3 slides to the upper surface of the support platform. The furnace door 4 of the curing-carbonization device is closed to form a sealed environment, and the formed object is heated to cure.

(4) Carbonization

The sealed layer of the curing-carbonization device is sealed after finishing the curing; the exhaust pipe 35 is responsible for vacuuming, and an inert gas is introduced from the intake pipe 34; the heating mechanism heats the parts up to 600-1500° C. in a vacuum or an inert gas atmosphere for manufacturing a large-size and complex carbon preform.

(5) Siliconizing

The carbon preform obtained in (4) is siliconized to yield a large-size and complex SiC ceramic object.

Preferably, in 1), the support platform is a square with a side length of 1 m to 10 m; the groove is fixed on the upper surface of the support platform, and the sidewall of the groove is lifted via the lifting mechanism by a maximum height of 10 m.

Preferably, the SLS device has a maximum lifting height of 10 m by the vertical driving mechanism.

Preferably, the inert gas described in (4) comprises nitrogen and argon; and the temperature for carbonization is 600-1500° C.

Preferably, the siliconizing method described in (4) comprises a precursor-infiltration-pyrolysis method, a chemical vapor infiltration method, and a reaction melt infiltration method (including liquid and vapor silicon infiltration).

It will be obvious to those skilled in the art that changes and modifications may be made, and therefore, the aim in the appended claims is to cover all such changes and modifications.

What is claimed is:

1. A device, comprising:
   1) a laser forming unit;
   2) a support platform; and
   3) a driving mechanism;
   wherein:
      the support platform is configured to support a plurality of raw materials for additive manufacturing of an object comprising a plurality of sections;
      the laser forming unit is disposed on the support platform and is configured to lay powders on a surface of each section of the object and sinter the powders;
      the driving mechanism is disposed under the laser forming unit and comprises a vertical driving mechanism and a horizontal driving mechanism;
      the vertical driving mechanism is connected to the laser forming unit and configured to lift the laser forming unit layer by layer according to a height of each section of the object so that the object is processed in a vertical direction with respect to the support platform;
      the horizontal driving mechanism is configured to drive the laser forming unit to move in a horizontal direction with respect to the support platform so that the laser forming unit moves over the support platform or separates from the support platform; and
      the laser forming unit comprises a powder laying unit and a plurality of heating units uniformly distributed above the powder laying unit.

2. The device of claim 1, wherein the laser forming unit comprises a housing, a separator, and a lasering unit; the powder laying unit is disposed in the housing and comprises a plurality of powder cylinders and a roller; the plurality of powder cylinders is symmetrically disposed on both sides of the support platform; the roller is configured to move back and forth between the plurality of powder cylinders and the support platform to bring the powders in the plurality of powder cylinders to the support platform; the separator is disposed in the housing and divides the housing to a first half and a second half; the lasering unit is disposed in the first half, comprises a laser and an oscillating mirror, and is configured to emit a laser to sinter the powders on the support platform; the plurality of heating units is disposed in the second half and is configured to preheat the powders on the support platform prior to the sintering of the powders.

3. The device of claim 1, wherein the support platform comprises a groove to accommodate the powders brought from a plurality of powder cylinders of the laser forming unit; the groove comprises a sidewall adapted to move vertically with respect to the support platforms.

4. The device of claim 2, wherein the support platform comprises a groove to accommodate the powders brought from the plurality of powder cylinders; the groove comprises a sidewall adapted to move vertically with respect to the support platform.

5. The device of claim 1, wherein a housing of the laser forming unit comprises an inner wall and a thermal insulation layer attached to the inner wall.

6. The device of claim 2, wherein the housing comprises an inner wall and a thermal insulation layer attached to the inner wall.

7. The device of claim 3, wherein a housing of the laser forming unit comprises an inner wall and a thermal insulation layer attached to the inner wall.

8. The device of claim 4, wherein the housing comprises an inner wall and a thermal insulation layer attached to the inner wall.

9. A system, comprising the device of claim 1, a powder cleaning device, and a curing-carbonization device; wherein the horizontal driving mechanism of the device comprises two guide rails disposed on both sides of the support platform; the device, the powder cleaning device, and the curing-carbonization device each comprises a plurality of pulleys adapted to slide on the guide rails.

10. The system of claim 9, wherein the powder cleaning device comprises a chamber, a rotating rail, an air outlet, and an air inlet; the rotating rail, the air outlet, and the air inlet are disposed in the chamber; and the air outlet and the air inlet are disposed on the rotating rail.

11. The system of claim 9, wherein the curing-carbonization device comprises a sealed chamber, an intake pipe, an exhaust pipe, and a heating mechanism disposed in the sealed chamber; and the intake pipe and the exhaust pipe are disposed on the seal chamber.

12. The system of claim 10, wherein the curing-carbonization device comprises a sealed chamber, an intake pipe, an exhaust pipe, and a heating mechanism disposed in the sealed chamber; and the intake pipe and the exhaust pipe are disposed on the seal chamber.

13. A method of forming an object using the system of claim 9, comprising:
   1) building a 3D model of an object, slicing the 3D model, and acquiring data of a plurality of section surfaces of the 3D model; employing a resin or a resin composite material as a raw material; placing the raw material in the laser forming unit comprising a housing, a separator, a powder laying unit, a lasering unit, and a plurality of heating units; according to the data of a plurality of section surfaces of the 3D model, laying, by the powder laying unit, powders on the support platform; preheating the powders by the plurality of heating units; sintering the powders by the lasering unit, to complete the processing of a first section of the object; lifting the laser forming unit, processing a second section of the object; repeating the lifting and processing, to yield a green part of the object;
   2) removing the SLS device from the support platform, moving the powder cleaning device on the support platform, opening the air outlet and the air inlet, rotating the rotating rail, to remove the powders on the green part of the object; and 3) removing the powder cleaning device from the support platform; moving the curing-carbonization device on the support platform, the curing-carbonization device comprising a sealed chamber and a heating mechanism, seamlessly connecting the sealed chamber and the support platform, and heating to cure the green part of the object by the heating mechanism; filling the sealed chamber with an inert gas or vacuumizing the sealed chamber, heating the green part to 600-1500° C. to yield a carbonized preform of the object, and siliconizing the carbonized preform to obtain a SiC ceramic object.

14. The method of claim 13, wherein in 3), siliconizing the carbonized preform adopts a precursor-infiltration-pyrolysis (PIP) method, a chemical vapor infiltration (CVI) method or a reactive infiltration method.

* * * * *